United States Patent [19]

Kameyama

[11] 4,408,388
[45] Oct. 11, 1983

[54] METHOD FOR MANUFACTURING A BIPOLAR INTEGRATED CIRCUIT DEVICE WITH A SELF-ALIGNMENT BASE CONTACT

[75] Inventor: Shuichi Kameyama, Yokohama, Japan

[73] Assignee: Tokyo Shibaura Denki Kabushiki Kaisha, Kasasaki, Japan

[21] Appl. No.: 252,119

[22] Filed: Apr. 8, 1981

[30] Foreign Application Priority Data

Apr. 14, 1980 [JP] Japan .................................. 55-49020

[51] Int. Cl.³ .......................................... H01L 21/308
[52] U.S. Cl. ......................................... 29/578; 29/590; 357/59; 156/657
[58] Field of Search ......................... 29/578, 579, 590; 148/188; 357/59; 156/653, 657

[56] References Cited

U.S. PATENT DOCUMENTS

| | | | |
|---|---|---|---|
| 3,753,807 | 8/1973 | Hoare et al. | 148/188 |
| 3,940,288 | 2/1976 | Tagaki et al. | 148/187 X |
| 3,958,323 | 5/1976 | De La Moneda | 29/578 X |
| 4,148,054 | 4/1979 | Hart et al. | 357/44 |
| 4,191,603 | 3/1980 | Garbarino et al. | 148/187 |
| 4,251,571 | 2/1981 | Garbarino et al. | 427/89 |

FOREIGN PATENT DOCUMENTS

2030002 3/1980 United Kingdom ............... 156/628

OTHER PUBLICATIONS

Translation of Parts of German Offenlegungsschrift No. 28 13 673 entitled "Method of Manufacturing a Semiconductor Arrangement".
Translation of an Article entitled "New Techniques in Semiconductors for the Communications Art" from 1234 Nachrichten Elektronik, vol. 32, No. 10 (Oct. 1978).

*Primary Examiner*—L. Dewayne Rutledge
*Assistant Examiner*—Alan E. Schiavelli
*Attorney, Agent, or Firm*—Finnegan, Henderson, Farabow, Garrett & Dunner

[57] ABSTRACT

A method for manufacturing a semiconductor integrated circuit device having a plurality of bipolar transistors is characterized in that, using an antioxidant insulation film pattern as a mask, an underlying conductive layer is overetched to form a conductive layer pattern; the antioxidant insulation film pattern is of overhanging structure with respect to the conductive pattern; a first thermally oxidized film is grown on the circumferential surface of the conductive layer pattern and a second thermally oxidized film is formed on the exposed part of a semiconductor substrate or semiconductor layer; and the second thermally oxidized film on the semiconductor substrate or the semiconductor layer is anisotropicetched away using the antioxidant insulation film pattern as a mask.

4 Claims, 20 Drawing Figures

METHOD FOR MANUFACTURING A BIPOLAR INTEGRATED CIRCUIT DEVICE WITH A SELF-ALIGNMENT BASE CONTACT

The present invention relates to a method for manufacturing a bipolar integrated circuit device.

A bipolar semiconductor circuit device such as an I²L (Integrated Injection Logic) is well known wherein the parasitic capacity is reduced, the transistor size is reduced to raise the packing density, or a transistor having an optimal impurity profile is provided in order to improve the operation speed or to reduce the power consumption.

Figure 1A:
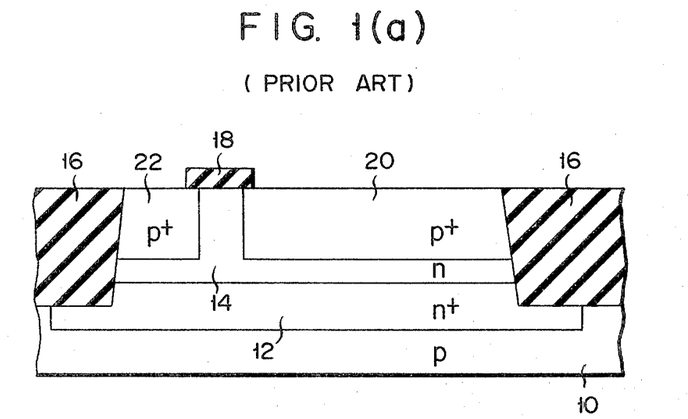
FIGS. 1(a) to 1(c) are sectional views of a semiconductor integrated circuit device for explaining the conventional method of manufacturing a semiconductor integrated circuit device.

One method for manufacturing an I²L circuit device is described in an article entitled, "Sub-nanosecond Self-aligned I²L/MTL Circuits" by D. D. Tang, T. H. Ning, S. K. Wiedmann, R. D. Isaac, G. C. Feth, and H. N. Yu in IEEE, IEDM, TECHNICAL DIGEST, 1979, pages 201 through 204. This method will first be described with reference to FIGS. 1(a) to 1(c). Referring to FIG. 1(a), an n⁺-type buried layer 12 is selectively formed in a p-type silicon substrate 10, and an n-type epitaxial layer 14 is grown thereover. A field oxide film 16 is formed by the oxide isolation technique. The region surrounded by the field oxide film 16 for forming an island semiconductor element is selectively covered with an SiO₂ film 18. Boron is ion-implanted in the epitaxial layer 14 using the SiO₂ film 18 and the field oxide film 16 as masks. Annealing is then performed to form a base region 20 and an injector 22 which are p⁺-type diffusion layers.

Figure 1B:
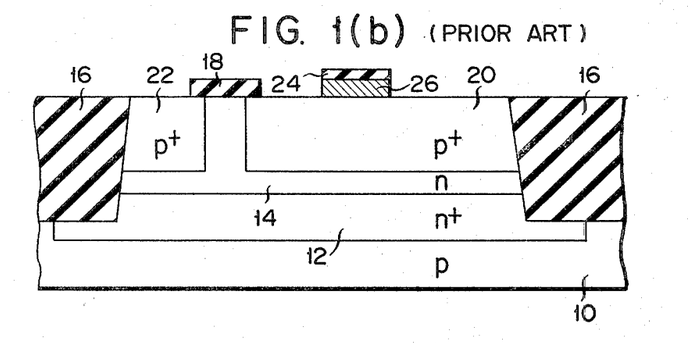

Referring to FIG. 1(b), a polycrystalline silicon layer in which are doped n-type impurity atoms such as arsenic is formed over the semiconductor plane, and an SiO₂ film is formed thereover by chemical vapor deposition. Thereafter, an SiO₂ film pattern 24 and a polycrystalline silicon film pattern 26 as the collector electrode of the I²L are formed by photoetching.

Figure 1C:
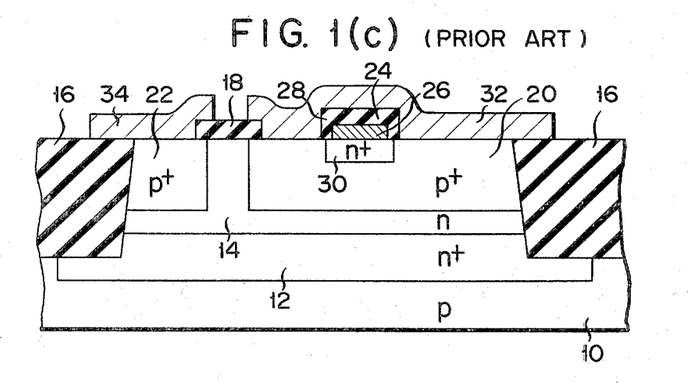

Referring to FIG. 1(c), by thermal oxidation at a high temperature, a relatively thick first thermally oxidized film 28 of 2,000 to 4,000 Å thickness is formed around the polycrystalline silicon film pattern 24, and another thermally oxidized film (not shown) of 200 to 400 Å thickness, which is thinner than the first thermally oxidized film 28, is formed on the exposed surface of the p⁺-type diffusion layer. Simultaneously with this step, arsenic in the polycrystalline silicon film pattern 26 is diffused in the p⁺-type base region 20 to form an n⁺-type collector region 30. The polycrystalline silicon pattern 26 is used as the collector wiring. Thereafter, the entire surface is etched to remove the second thermally oxidized film on the surface of the p⁺-type diffusion layer. Aluminum, for example, is deposited thereover and patterned to form a base-connecting electrode 32 and an injector-connecting electrode 34.

Since most of the surface of the base region 20 of the npn transistor is in electrical contact with the base-connecting electrode 32 of aluminum, the I²L manufactured in the manner described above is advantageous in that the base resistance may be made small, the operating speed of the I²L may be made greater, and the packing density of the I²L may be improved due to self alignment of the collector region 30 and the contact part of the base region 20 of the npn transistor. However, this method still has some problems to be described below:

(a₁) Since the top surface of the polycrystalline silicon film pattern 26 on which is formed the CVD-SiO₂ film pattern 24 is also oxidized when the circumferential surface of the polycrystalline silicon film pattern 26 is thermally oxidized, the film thickness of the polycrystalline silicon film pattern 26 is reduced. This results in an increase in the sheet resistance of the polycrystalline silicon film pattern 26 and in the collector resistance.

(a₂) Due to the reduction in the film thickness of the polycrystalline silicon film pattern 26 described in item (a₁) above, the step of thermal oxidation of the circumferential surface of the polycrystalline silicon film pattern 26 cannot be performed over a long period of time. Thus, since the film thickness of the first thermally oxidized film 28 around the circumferential surface of the polycrystalline silicon film pattern 26 may not be made sufficiently great, the dielectric breakdown voltage between the collector electrode consisting of the polycrystalline silicon film pattern 26 and the base-connecting electrode 32 tends to be insufficient.

(a₃) The first thermally oxidized film 28 grown on the circumferential surface of the polycrystalline silicon film pattern 26 by thermal oxidation has a high etching rate due to precipitation of arsenic impurity atoms, which are doped in the polycrystalline silicon film pattern 26. When the thin second thermally oxidized film (not shown) on the p⁺-type diffusion layer (the base region 20 and the injector 22) is removed, the first thermally oxidized film 28 on the circumferential surface of the polycrystalline silicon film pattern 26 tends to be reduced. Furthermore, as indicated in items (a₁) and (a₂) above, the first thermally oxidized film 28 may not be made thick. Consequently, the end part of the n⁺-type collector region 30 formed in the p⁺-type base region 20 is exposed through the first thermally oxidized film 28, frequently causing short-circuiting between the base-connecting electrode 32 and the collector region 30.

A method for manufacturing an MOS transistor is disclosed in the article entitled, "A Quadruply Self-Aligned MOS (QSA MOS)" by Kuniichi Ohta, Kunio Yamada, Kyozo Shimizu, and Yasui Tarui in IEEE, IEDM, TECHNICAL DIGEST, 1979, pages 581 through 584. According to this method, a layer consisting of a gate SiO₂ film, a polycrystalline Si film, a CVD-SiO₂ film, and an Si₃N₄ film is patterned to form a gate part of the MOS transistor; anisotropic etching is performed using the overhanging part of the Si₃N₄film as a mask after thermally oxidizing the gate part; and the openings for the contacts of the source region and the drain region of the MOS transistor are self-aligned. This method is advantageous in that (1) the channel length of the MOS transistor may be made short, (2) short-channel effect may be prevented, (3) high speed operation of the MOS transistor is possible since the overlap capacitance between the source/drain electrode and the gate electrode may be kept small, (4) the metal wiring and the source/dain region may be high-conductance interconnected, and (5) this device may be made in a highly self-aligned structure. This method is intended to improve the characteristics of the MOS transistor and is not intended solely for bipolar transistors.

It is the first object of the present invention to provide a method for manufacturing a semiconductor integrated circuit device comprising a plurality of bipolar transistors, each adopting a conductor pattern having a relatively thick thermally oxidized film grown by self alignment.

It is the second object of the present invention to provide a method for manufacturing a semiconductor integrated circuit device comprising a plurality of bipolar transistors with excellent insulating characteristics.

It is the third object of the present invention to provide a method for manufacturing a semiconductor integrated circuit device comprising a plurality of bipolar transistors which eliminate the increase in the sheet resistance which might otherwise result from thermal oxidation of the wiring.

In order to accomplish the above and other objects, the present invention provides a method for manufacturing a semiconductor integrated circuit. According to this method, a conductive layer is formed directly or through an insulation layer on a semiconductor substrate or a semiconductor layer. After forming an antioxidant insulation film on the conductive layer, the antioxidant insulation film is patterned to form an antioxidant insulation film pattern. Using the antioxidant insulation film pattern as a mask, the conductive layer is overetched to form a conductive pattern. In this case, the antioxidant insulation film pattern overhangs the conductive pattern. Thermal oxidation is then performed to grow a first thermally oxidized film on the circumferential surface of the conductive pattern and to grow a second thermally oxidized film which is thinner than the first thermally oxidized film on the exposed semiconductor substrate or semiconductor layer. The thin second thermally oxidized film on the semiconductor substrate or semiconductor layer is etched away and an electrode wiring electrically insulated from the conductive pattern is formed.

According to these steps, since the conductive pattern may be formed by self-alignment, a bipolar transistor of high performance may advantageously be formed and the manufacturing yield of the semiconductor integrated circuit may be improved.

If the thin second thermally oxidized film on the semiconductor substrate or semiconductor layer is etched by anisotropic etching with gaseous ions substantially vertically incident on the semiconductor substrate or semiconductor layer surface, the reduction in the film thickness of the first thermally oxidized film may be further eliminated.

If, after removing the second thermally oxidized film on the semiconductor substrates or the semiconductor layer, atoms of the same conductivity type as that of removed semiconductor region are implanted in the region, the electrical contact between the metal wiring and the semiconductor region may be improved. Since the physical distance between the conductive pattern and the atom-implanted region may be made greater according to the present invention, the breakdown voltage therebetween may be made higher.

According to another form of the method of the present invention, a conductive layer is formed directly or through a first insulation layer on a semiconductor substrate or a semiconductor layer, and a second insulation layer is formed on the conductive layer. After forming an antioxidant insulation film on the second insulation layer, the antioxidant insulation film is patterned to form an antioxidant insulation film pattern. The conductive layer lying thereunder is overetched using the antioxidant insulation film pattern as a mask to form a conductive pattern. In this case, the antioxidant insulation film pattern overhangs the conductive pattern.

Thereafter, thermal oxidation is performed to grow a first thermally oxidized film on the circumferential surface of the conductive pattern and to grow a second thermally oxidized film which is thinner than the first thermally oxidized film on the exposed semiconductor substrate or semiconductor layer.

The thin second thermally oxidized film on the semiconductor substrate or semiconductor layer is etched to form an electrode wiring which is electrically insulated from the conductive pattern.

Other features and advantages of the invention will be apparent from the following description when taken in conjunction with the accompanying drawings in which.

Figure 2A:
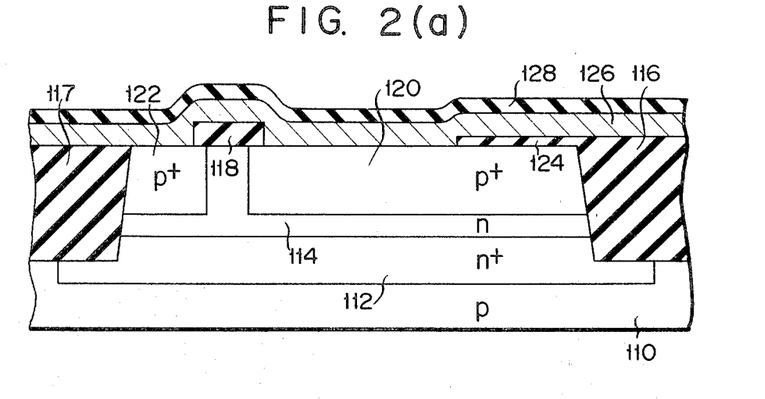
FIGS. 2(a) to 2(e) are sectional views of a semiconductor integrated circuit device for explaining the method for manufacturing a semiconductor integrated circuit device according to the present invention.

The first embodiment of the present invention will now be described with reference to FIGS. 2(a) to 2(e). Referring to FIG. 2(a), antimony Sb is selectively diffused in a p-type silicon substrate 110 to form an n+-type buried layer 112. An n-type silicon epitaxial layer 114 is grown thereover, and field oxide films 116 and 117 of 1.5 μm thickness for semiconductor isolation are formed by the oxide isolation technique. An $SiO_2$ layer is formed on the epitaxial layer 114 by the CVD method (chemical vapor deposition). The $SiO_2$ layer is selectively photoetched to form an $SiO_2$ film 118. Boron is selectively ion-implanted in the epitaxial layer 114 using the $SiO_2$ film 118 and the field oxide films 116 and 117 as masks. By annealing, a base region 120 and an injector 122 which are p+-type diffusion layers are formed. Thereafter, a thermally oxidized silicon film 124 extending from the field oxide film 116 over part of the base region 120 is formed by thermal oxidation and photoetching. An arsenic-doped polycrystalline silicon layer 126 with an arsenic concentration of $10^{21}/cm^3$ and a thickness of 3,000 Å is formed on the field oxide films 116 and 117, the base region 120, the injector 122, the $SiO_2$ film 118, and the thermally oxidized silicon film 124. An antioxidant insulation film 128 of silicon nitiride ($Si_3N_4$) is deposited thereover to a thickness of 1,000 Å.

Figure 2B:
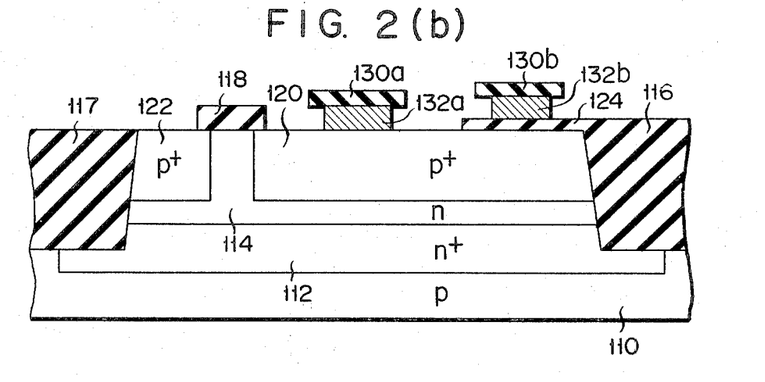

Referring to FIG. 2(b), the silicon nitride film 128 is patterned by photoetching to form silicon nitride film pattern 130a on part of the polycrystalline silicon layer 126 on the base region 120 and silicon nitride film pattern 130b on part of the polycrystalline silicon layer 126 on the thermally oxidized silicon film 124. The arsenic-doped polycrystalline silicon layer 126 is overetched using the silicon nitride film patterns 130a and 130b as masks so as to obtain an overhanging structure of the silicon nitride film patterns 130a and 130b. Polycrystalline silicon patterns 132a and 132b are formed by the above steps.

Figure 2C:
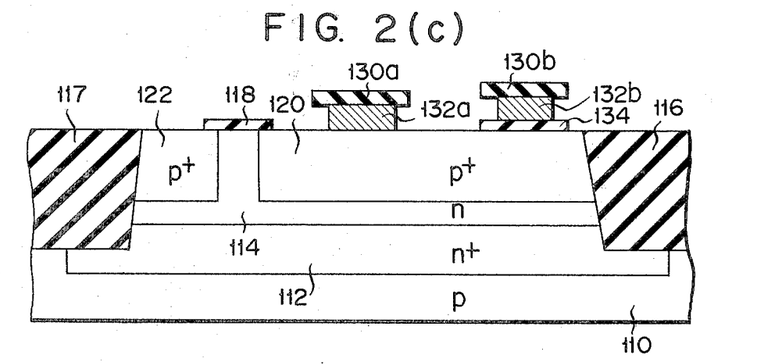

Referring to FIG. 2(c), the thermally oxidized silicon film 124 is etched by reactive ions using the silicon nitride film pattern 130b as a mask to form a thermally oxidized film pattern 134. At this time, the thermally oxidized film pattern 134 is self-aligned with respect to the silicon nitride film pattern 130b. The $SiO_2$ film 118 formed between the end part of the base region 120 and the end part of the injector 122 is also etched to the same thickness as the thermally oxidized film pattern 134.

Figure 2D:
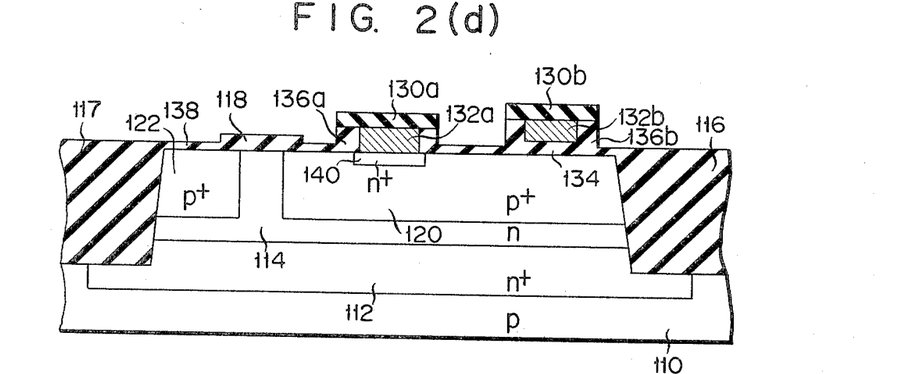

Referring to FIG. 2(d), the semiconductor device of FIG. 2(c) is subjected to thermal oxidation. This thermal oxidation is performed to form relatively thick, first thermally oxidized films 136a and 136b on the circumferential surfaces of the polycrystalline silicon patterns 132a and 132b, and to form a second thermally oxidized film 138, which is thinner than the first thermally oxidized films 136a and 136b, on the exposed base region 120 and the injector 122 utilizing the difference between the oxidation rate of the base region 120 and the injector 122 and that of the polycrystalline region 120 and the injector 122 and that of the polycrystalline silicon patterns 132a and 132b. When the temperature for the thermal oxidation is over 1,000° C., the oxidation rate ratio of the polycrystalline silicon patterns 132a and 132b to the base region 120 and the injector 122 becomes small, so that such a temperature may not be applicable to this embodiment. For this reason, it is preferable that this thermal oxidation be performed in a steam or wet oxygen atmosphere of relatively low temperature, such as 700° to 900° C., wherein the oxidation rate ratio of the polycrystalline silicon layers 132a and 132b to the base region 120 and the injector 122 is 4 to 10 or more. According to this embodiment, the thermal oxidation is performed in a wet oxygen atmosphere of relatively low temperature, i.e., 700° C., to form the relatively thick first thermally oxidized films 136a and 136b of, for example, 5,000 Å thickness, on the circumferential surfaces of the polycrystalline silicon patterns 132a and 132b and to form the thin second thermally oxidized silicon film 138 of, for example, 800 Å thickness, on the exposed base region 120 and the injector 122. In this case, since the silicon nitride film patterns 130a and 130b blocking the introduction of oxygen are provided on the polycrystalline silicon patterns 132a and 132b, almost no reduction in the film thickness of the polycrystalline silicon patterns 132a and 132b occurs. Thus, the increase in the sheet resistance due to oxidation along the direction of the thickness of the polycrystalline silicon patterns 132a and 132b may be prevented. Since the oxidation of the top surfaces of the polycrystalline silicon patterns 132a and 132b may be prevented in this manner, the thermal oxidation may be performed without concern for the film thickness reduction of the polycrystalline silicon patterns 132a and 132b. Thus, since a longer thermal oxidation may be performed as compared with the conventional method, the thermally oxidized silicon films 136a and 136b formed on the circumferential surfaces of the polycrystalline silicon patterns 132a and 132b may be formed thicker. A thickness of 5,000 Å or more may be realized when the oxidation time is longer than that of this embodiment. Since the oxidation of the top surfaces of the polycrystalline silicon patterns 132a and 132b may be reduced even when the processing temperature is elevated, the processing temperature may be elevated from 700° C., to for example, 1,000° to 1,050° C. In such a case, the film thickness of the first thermally oxidized silicon films 136a and 136b and the second thermally oxidized silicon film 138 may be made substantially the same.

During this thermal oxidation, arsenic is diffused to the base region 120 from the arsenic-doped polycrystalline silicon pattern 132a contiguous with the base region 120 to form an $n^+$-type diffusion layer 140.

Figure 2E:
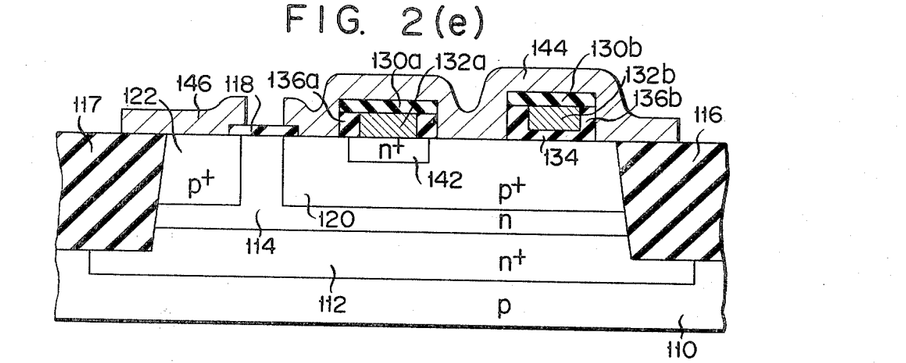

Referring to FIG. 2(e), annealing is performed in a nitrogen atmosphere at a high temperature to diffuse arsenic from the arsenic-doped polycrystalline silicon pattern 132a directly in contact with the base region 120 to the $n^+$-type diffusion layer 140 to form an $n^+$-type collector region 142. Thereafter, the second thermally oxidized silicon film 138 is etched for forming openings (contact holes) for the electrode wiring. The etching method for this may be wet etching, which is a type of isotropic etching, plasma etching, or anisotropic etchching (e.g., a reactive ion etching or a reactive ion beam etching) by gaseous ions which are substantially vertically incident on the surface to be etched. As shown in FIG. 2(e), since the silicon nitride film patterns 130a and 130b may be used as masks in this embodiment, it is better to anisotropically etch the second thermally oxidized silicon film 138 by the reactive ion etching method. Since the relatively thick first thermally oxidized silicon films 136a and 136b below the silicon nitride film patterns 130a and 130b are concealed by the overhanging parts of the silicon nitride film patterns 130a and 130b, the first thermally oxidized silicon films 136a and 136b are not etched by the reactive ions which are substantially vertically incident on the second thermally oxidized silicon film 138, so that the first thermally oxidized silicon films 136a and 136b grown by thermal oxidation remains on the circumferential surfaces of the polycrystalline silicon patterns 132a and 132b after etching. Then, the second thermally oxidized silicon film 138 on the base region 120 and the injector 122 is selectively etched to expose the base region 120 and the injector 122. Thereafter, an aluminum film is deposited by vacuum deposition on the entire surface. The aluminum film on the $SiO_2$ film 118 near the base region 120 and the injector 122 and on the field oxide film 117 is removed by photoetching to form a base-connecting electrode 144 connected with the entirety of the base region 120 and an injector-connecting electrode 146, thus completing an $I^2L$. The polycrystalline silicon pattern 132a covered with the first silicon nitride film pattern 130a and the first thermally oxidized silicon film 136a and connected to the collector region 142 functions as a collector electrode. The polycrystalline silicon pattern 132b covered with the second silicon nitride film pattern 130b and the first thermally oxidized silicon film pattern 136b and arranged on the base region 120 through the thermally oxidized film pattern 134 functions as a jumper wire.

The characteristics of the $I^2L$ of the above construction may be summarized as follows:

(1) Since the top surfaces of the arsenic-doped polycrystalline silicon pattern 132a used as the diffusion source for forming the collector region and as the collector electrode and polycrystalline silicon pattern 132b used as the jumper wire are covered with the silicon nitride film patterns 130a and 130b with excellent oxidation-blocking functions, respectively, oxidation of the polycrystalline silicon patterns 132a and 132b in the direction of their thickness during thermal oxidation may be prevented. Thus, the reduction in the film thickness of the polycrystalline silicon patterns 132a and 132b is small, providing a collector electrode and a jumper wire of small sheet resistance.

(2) Since the thermal oxidation may be performed without considering the reduction of the film thickness of the polycrystalline silicon patterns 132a and 132b, sufficiently thick first thermally oxidized silicon films 136a and 136b may be grown on the circumferential surfaces of the polycrystalline silicon patterns 132a and 132b. When the second thermally oxidized silicon film 138 on the base region 120 and the injector 122 is removed, the reduction in the film thickness of the first oxidized silicon films 136a and 136b may be prevented by etching the second thermally oxidized silicon fim 138 with reactive ions substantially vertically incident thereon using the silicon nitride film patterns 130a and 130b having overhanging structure as masks. Consequently, since the contact part between the base region 120 and the base-connecting electrode 144 may be sufficiently spaced apart from the junction plane of the base region 120 and the collector region 142, short-circuiting between the base and the collector seldom occurs.

(3) since the silicon nitride film patterns 130a and 130b may be formed to a desired thickness and the first thermally oxidized silicon films 136a and 136b may also be formed to a desired thickness, the insulation resistances may be improved between the polycrystalline silicon pattern 132a as the collector electrode and the base-connecting electrode 144, and between the polycrystalline silicon pattern 132b as the jumper wire and the base-connecting electrode 144.

(4) The polycrystalline silicon patterns 132a and 132b and the base contact parts may be self-aligned by using the silicon nitride film patterns 130a and 130b as masks so that the dielectric breakdown voltage between them is sufficient. Thus, the yield of the I²Ls is improved.

The advantages as described above may be obtained in the above embodiment. However, when the thermal oxidation for forming the first thermally oxidized silicon films 136a and 136b on the circumferential surfaces of the polycrystalline silicon patterns 132a and 132b and for forming the second thermally oxidized silicon film 138 on the surface of the base region 120 and the injector 122 is performed in an oxygen atmosphere at a relatively high temperature of 1,000 to 1,050° C., the film thicknesses of the first and second thermally oxidized silicon films may be made substantially equal within a short processing period. In this case, the second thermally oxidized silicon film 138 becomes a thick film of several thousand angstroms. In such a case, the anisotropic etching with reactive ions is particularly effective. With the isotropic etching, the reduction in the film thicknesses of the first thermally oxidized silicon films 136a and 136b is greater when the film thickness of the second thermally oxidized silicon film 138 is thicker. This tends to result in short-circuiting between the collector region 142 and the base-connecting electrode 144 or in insufficient dielectric breakdown voltage between the polycrystalline silicon patterns 132a and 132b and the base-connecting electrode 144. However, when the anisotropic reactive ion etching is performed using the silicon nitride film patterns 130a and 130b as masks, the first and second thermally oxidized silicon films are self-aligned with the end parts of the silicon nitride film patterns 130a and 130b so that the reduction in the film thickness of the first thermally oxidized silicon films 136a and 136b may be small and the drawbacks as described above may be prevented.

The polycrystalline silicon patterns 132a and 132b as the conductive layers may be replaced by phosphorus-doped n-type polycrystalline silicon layers; boron-doped p-type polycrystalline silicon layers; undoped polycrystalline silicon layers; or metal silicide layers of, for example, molybdenum silicide, tungsten silicide, tantulum silicide or the like. The impurity-doped polycrystalline silicon layers, when used as the conductive layers, are advantageous in that they may be used as the diffusion source for forming the collector region or the like, and they may be used as electrode wirings having low resistance.

The metal wiring material may include, in addition to Al, aluminum alloys such as Al-Cu, Al-Si, and Al-Si-Cu; metals such as Mo, W, Ta, and Pt; and metal silicides thereof.

The second embodiment of the present invention will now be described with reference to FIGS. 3(a) to 3(f) and FIG. 4. The steps shown in FIGS. 3(a) to 3(d) are the same as in the first embodiment. Thus, in the step shown in FIG. 3(a), Sb is selectively diffused in the p-type silicon substrate 110 to form the n+-type buried layer 112. The n-type silicon epitaxial layer 114 is grown thereover. Thereafter, the field oxide films 116 and 117 are formed, and the $SiO_2$ film 118 is formed on the epitaxial layer 114 in the same manner as in the former embodiment. After selectively ion-implanting boron, annealing is performed to form the base region 120 and the injector 122. After forming the thermally oxidized silicon film 124 over part of the base region 120, the arsenic-doped polycrystalline silicon layer 126 is deposited over the entire surface. The silicon nitride film 128 is deposited thereover to function as an antioxidant insulation film.

Figure 3A:
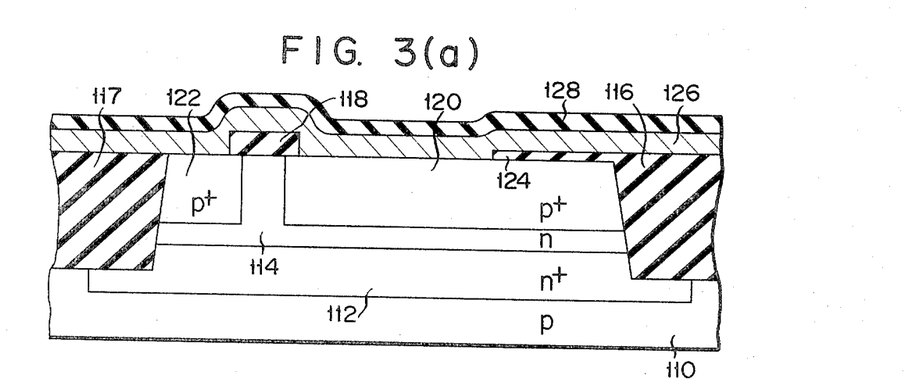
FIGS. 3(a) to 3(f) are sectional views of a semiconductor integrated circuit device for explaining another method for manufacturing a semiconductor integrated circuit device according to the present invention.
Figure 3B:
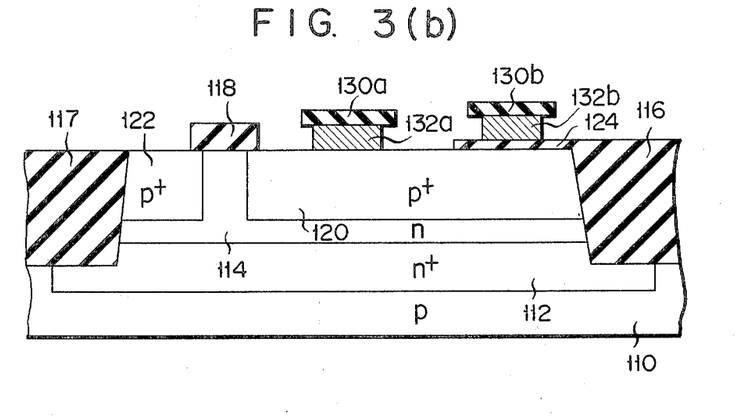

Referring to FIG. 3(b), the silicon nitride film 128 is patterned to form the silicon nitride film patterns 130a and 130b. Using the silicon nitride film patterns as masks, the polycrystalline silicon layer 126 is overetched to form polycrystalline silicon patterns 132a and 132b. In this step, the silicon nitride film patterns 130a and 130b are made to overhang the polycrystalline silicon patterns 132a and 132b.

Figure 3C:
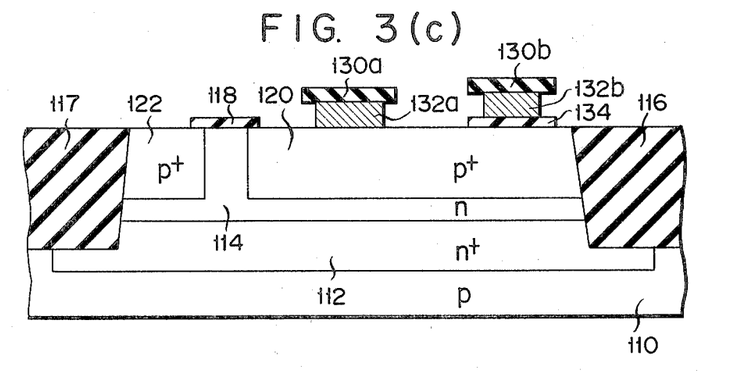

Referring to FIG. 3(c), anisotropic reactive ion etching is performed using the silicon nitride film pattern 130b as a mask to form the thermally oxidized film pattern 134 and to etch the $SiO_2$ film 118 to the same thickness as that of the thermally oxidized pattern 134.

Figure 3D:
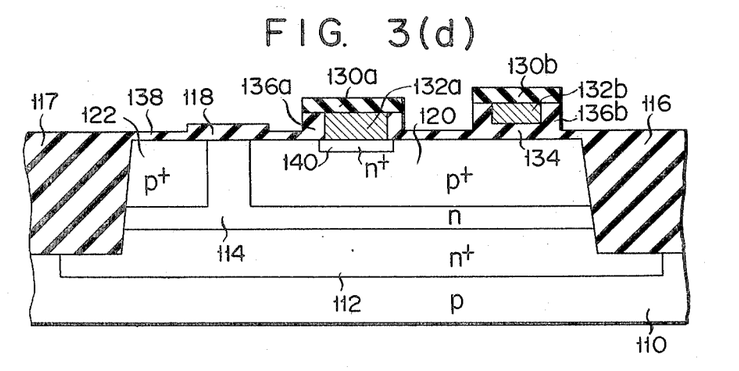

Referring to FIG. 3(d), thermal oxidation is performed in a wet atmosphere at a low temperature, i.e., 700° C., to form the first thermally oxidized silicon films 136a and 136b and the second thermally oxidized silicon film 138. During this thermal oxidation, arsenic is diffused from the polycrystalline silicon pattern 132a to the base region 120 to form the n+-type diffusion layer 140.

Figure 3E:
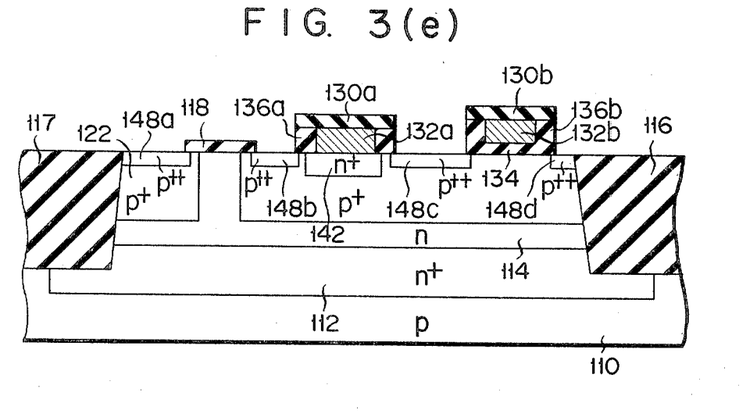

Referring to FIG. 3(e), annealing is performed in a nitrogen atmosphere at a high temperature to diffuse further arsenic from the polycrystalline silicon pattern 132a to form the n+-type collector region 142. Thereafter, using the silicon nitride film patterns 130a and 130b as masks, contact holes for the electrode wirings are formed by reactive ion etching according to which reactive ions are substantially vertically incident on the second thermally oxidized silicon film 138. After implanting ions of the same conductivity type as the base region 120 and the injector 122 substantially vertically to the contact hole surfaces, thermal annealing is performed to form high concentration ion-implanted regions 148a, 148b, 148c and 148d. Since these high concentration ion-implanted regions 148a, 148b, 148c and 148d facilitate electrical contacts between the base-connecting electrode 144 and base region 120 and between the injector-connecting electrode 146 and injector 122 formed in the next step to reduce the base resistance and injector resistance of the npn transistor, the operating speed of the semiconductor device is also improved. In this case, when the distance between the end part of the collector region 142 and the end part of the ion-implanted regions 148b and 148c is small, the breakdown voltage between the collector region 142 and the base region 120 during reverse bias is reduced so that the logic functions of the I²L may not be guaranteed. However, in this embodiment, since the silicon nitride film pattern 130a functions as the mask during the ion implantation as was described with reference to the above embodiment, the end parts of the ion-implanted regions 148b and 148c are self-aligned with respect to the silicon nitride film pattern 130a. Thus, it is not only possible to correctly determine the distance between the end parts of the collector region 142 and the end parts of the ion-implanted regions 148b and 148c, but also to increase the above-mentioned distance depending on the degree of overhanging of the silicon nitride film pattern 130a.

Figure 3F:
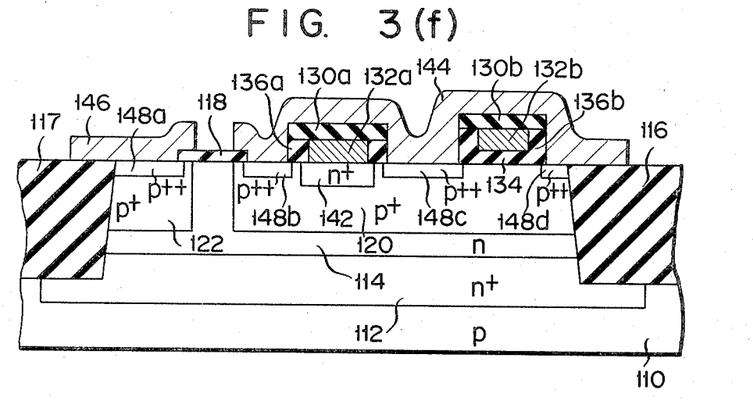

Referring to FIG. 3(f), an aluminum film is formed on the entire surface by vacuum deposition and is patterned by photoetching to form the base-connecting electrode 144 and the injector-connecting electrode 146, thus completing an I²L. As has been described, the base-connecting electrode 144 is in electrical contact with the ion-implanted regions 148b, 148c, and 148d, with a low contact resistance. Similarly, the injector-connecting electrode 146 and the ion-implanted region 148a are in electrical contact with a low contact resistance.

Figure 4:
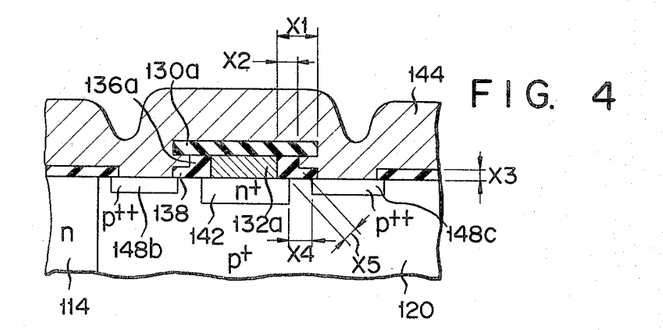
FIG. 4 is a sectional view of a semiconductor integrated circuit device for explaining another method for manufacturing a semiconductor integrated circuit device according to the present invention.

Referring to FIG. 4, the relation will be described of a length X1 of the overhanging part of the silicon nitride film pattern 130a, a film thickness X2 of the first thermally oxidized silicon film 136a, a film thickness X3 of the second thermally oxidized silicon film 138, a distance X4 between the end parts of the collector region 142 and the ion-implanted regions 148b and 148c, and a shortest distance X5 between the end part of the collector region 142 and the base-connecting electrode 144. The end part of the collector region 142 is self-aligned by the thermal oxidation and annealing independently of the size of the silicon nitride film pattern 130a. However, since the end parts of the ion-implanted regions 148b and 148c are self-aligned with respect to the silicon nitride film pattern 130a, the distance X1 of the overhanging part of the silicon nitride film pattern 130a is increased for increasing the distance X4 between the collector region 142 and the ion-implanted regions 148b and 148c. For increasing the distance between the end part of the collector region 142 and the base-connecting electrode 144, the film thickness X2 of the first thermally oxidized silicon film 136a or the film thickness X3 of the second thermally oxidized silicon film 138 is increased.

Since the length X1 of the overhanging part of the silicon nitride film pattern 130a, the film thickness X2 of the first thermally oxidized silicon film 136a, and the film thickness X3 of the second thermally oxidized film 138 may be freely controlled, according to the present invention, it is possible to design for suitable values of the distance X4 between the end parts of the collector region 142 and the ion-implanted regions 148b and 148c and the distance X5 between the end part of the collector region 142 and the base-connecting electrode 144.

When the length X1 of the overhanging part of the silicon nitride film pattern 130a is made equal to the film thickness X2 of the first thermally oxidized silicon film 136a, none of the space below the overhanging part of the silicon nitride film pattern 130a is formed.

Figure 5A:
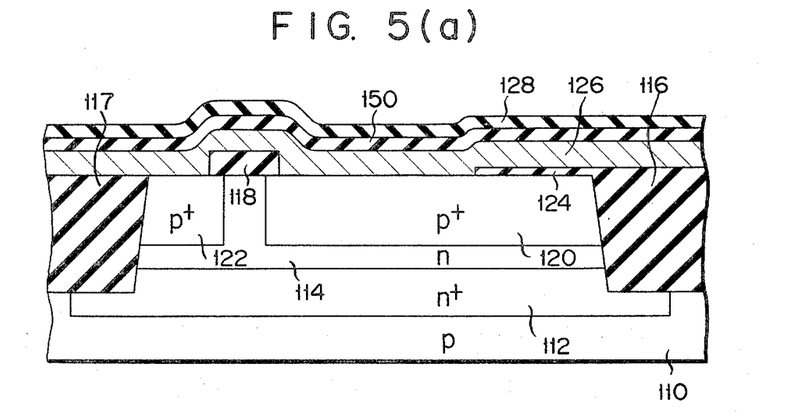
FIGS. 5(a) to 5(e) are sectional views of a semiconductor integrated circuit device for explaining a modified method for manufacturing a semiconductor integrated circuit device according to the present invention.

The third embodiment of the present invention will now be described with reference to FIGS. 5(a) to 5(e). Referring to FIG. 5(a), as in the case of the first embodiment, the n-type arsenic-doped polycrystalline silicon layer 126 is formed as the conductive layer (arsenic concentration, $10^{21}/cm^3$; film thickness, 3,000 Å) on the entire surface of the n-type epitaxial layer 114, and thereafter a CVD-SiO$_2$ film 150 of about 2,000 Å thickness and the silicon nitride film 128 of 1,000 Å thickness as the antioxidant insulation film are formed thereover in the order named.

Figure 5B:
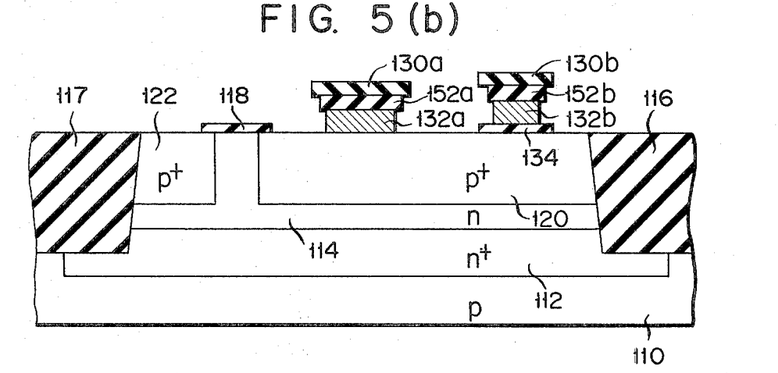

Referring to FIG. 5(b), the silicon nitride film 128 is patterned by photoetching to form the silicon nitride film patterns 130a and 130b on the part of the CVD-SiO$_2$ film 150 on the base region 120 and on the part of the CVD-SiO$_2$ film 150 on the thermally oxidized silicon film 124, respectively. The CVD-SiO$_2$ film 150 is overetched using the silicon nitride film patterns 130a and 130b as masks. The underlying polycrystalline silicon layer 126 is also overetched to form CVD-SiO$_2$ film patterns 152a and 152b and the polycrystalline silicon patterns 132a and 132b. In this case, the silicon nitride film patterns 130a and 130b are of overhanging structure with respect to the CVD-SiO$_2$ film patterns 152a and 152b, and the CVD-SiO$_2$ film patterns 152a and 152b are of overhanging structure with respect to the polycrystalline silicon patterns 132a and 132b. Thereafter, the thermally oxidized silicon film 124 on the base region 120 is etched by reactive ions substantially vertically incident on the semiconductor major surface using the silicon nitride film pattern 130b as a mask to form the thermally oxidized pattern to be self-aligned with the silicon nitride film pattern 130b.

Figure 5C:
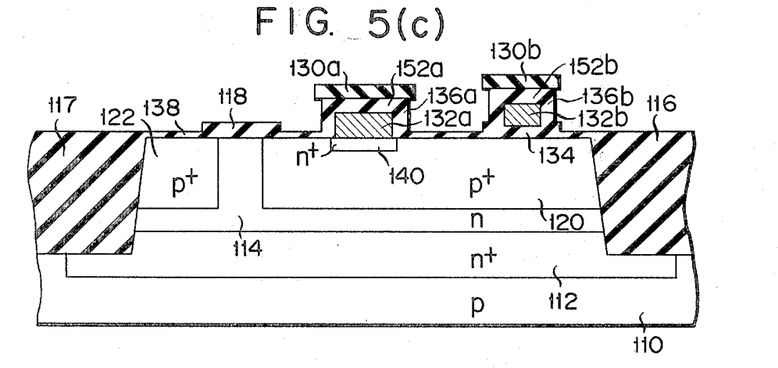

Referring to FIG. 5(c), thermal oxidation is then performed in a wet atmosphere at a low temperature, i.e., 700° C. During this step, the first thermally oxidized silicon films 136a and 136b of 5,000 Å thickness formed integrally with the CVD-SiO$_2$ film patterns 152a and 152b are formed on the circumferential surfaces of the polycrystalline silicon patterns 132a and 132b, and the second thermally oxidized silicon film 138 of 800 Å thickness is formed on the exposed base region 120 and the injector 122, utilizing the difference between the oxidation rate of the arsenic-doped polycrystalline silicon patterns 132a and 132b and that of the exposed base region 120 and the injector 122.

Since the silicon nitride film patterns 130a and 130b blocking the introduction of oxygen through the thin CVD-SiO$_2$ films 152a and 152b are present on the polycrystalline silicon patterns 132a and 132b, there is almost no reduction in the film thickness of the polycrystalline silicon patterns 132a and 132b. Furthermore, during this thermal oxidation step, arsenic is diffused to the base region 120 from the polycrystalline silicon pattern 132a directly in contact with the base region to form the n+-type diffusion layer 140.

Figure 5D:
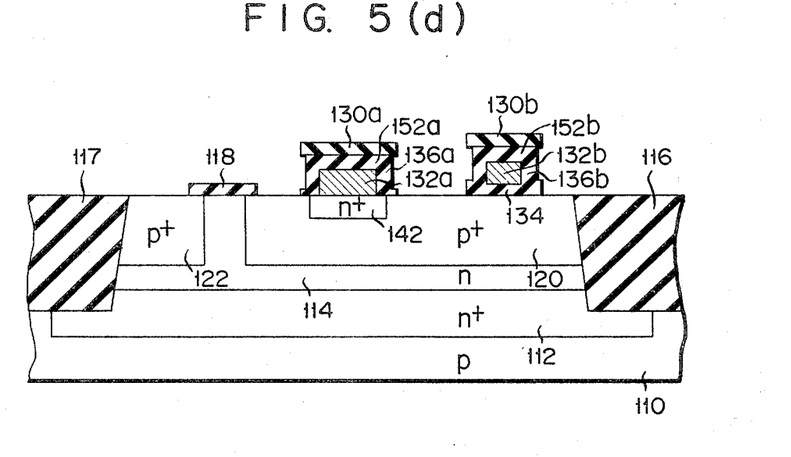

Referring to FIG. 5(d), further annealing is performed in a high-temperature nitrogen atmosphere to further diffuse to the base region 120 arsenic in the arsenic-doped polycrystalline silicon pattern 132a directly in contact with the base region 120 to form the n+-type collector region 142. Etching is then performed for a short period of time by reactive ions which are substantially vertically incident on the surface of the semiconductor layer. Since the silicon nitride film patterns 130a and 130b function as masks, the CVD-SiO$_2$ film patterns 152a and 152b and the first thermally oxidized silicon films 136a and 136b below the overhanging parts of the silicon nitride film patterns 130a and 130b are concealed so that they are not etched much. The second thermally oxidized silicon film 138 on the base region 120 and the injector 122 is selectively etched to expose the base region 120 and the injector 122.

Figure 5E:
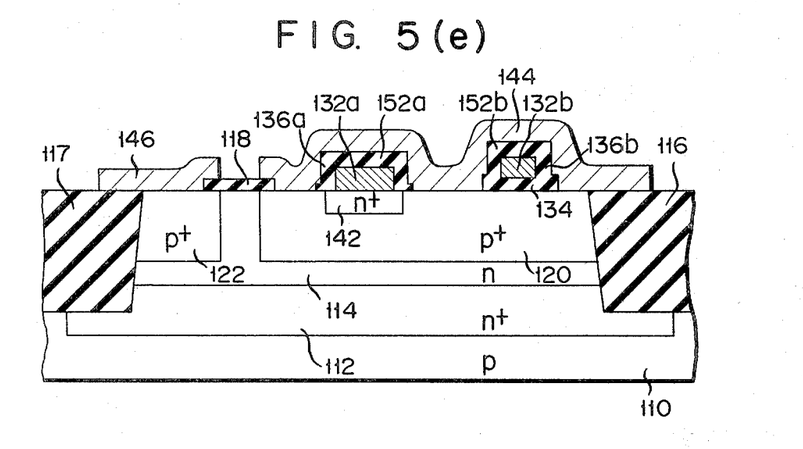

Referring to FIG. 5(e), after removing the silicon nitride film patterns 130a and 130b, an aluminum layer is formed by vacuum deposition over the entire surface. The aluminum layer is patterned by photoetching to form the base-connecting electrode 144 and the injector-connecting electrode 146. Since the base-connecting electrode 144 and the injector-connecting electrode 146 are self-aligned with the entire surfaces of the base region 120 and the injector 122, respectively, the base resistance of the npn transistor and the emitter resistance of the injector are small. The polycrystalline silicon pattern 132a, whose circumferential surfaces are covered with the CVD-SiO$_2$ film pattern 152a and the first thermally oxidized silicon film 136a and connected with the collector region 142 functions as the collector electrode. The polycrystalline silicon pattern 132b, whose circumferential surfaces are covered with the CVD-SiO$_2$ film pattern 152b and the first thermally oxidized silicon film 136b and arranged on the base region 120 through the thermally oxidized film pattern 134 functions as the jumper wire.

The I$^2$L manufactured in this embodiment, as in the case of the former embodiments, has the collector electrode 132a and the jumper wire 132b which do not cause an increase in the sheet resistance which might otherwise be caused by the reduction in the film thickness. Further, the I$^2$L has an excellent dielectric breakdown voltage between the contact holes of the base region 120 and the collector region 142. This I$^2$L has a further feature of an extremely high dielectric breakdown voltage between the collector electrode 132a, the jumper wire 132b, and the base-connecting electrode 144.

It is also possible to form ion-implanted regions of high concentration and of the same conductivity type as the base region 120 and the injector 122 as in the case of the second embodiment (FIG. 3(e)). The CVD-SiO$_2$ film patterns 152a and 152b need not be overetched but may be formed to be of the same width as the silicon nitride film patterns 130a and 130b.

What is claimed is:

1. A method for manufacturing a semiconductor integrated circuit device having a plurality of bipolar transistors at least one of which includes a base region, comprising the steps of:

forming a conductive layer directly on the base region;
   forming an antioxidant insulation film of high insulation characteristic on said conductive layer;
   patterning said antioxidant insulation film to form an antioxidant insulation film pattern;
   overetching said underlying conductive layer using said antioxidant insulation film pattern as a mask to form a conductive layer pattern such that said antioxidant insulation film pattern overhangs said conductive layer pattern;
   thermally oxidizing the circumferential surface of said conductive layer pattern and an exposed part of said base region to grow a first thermally oxidized film on the circumferential surface of said conductive layer pattern and a second thermally oxidized film on the exposed part of said base region;
   said first thermally oxidized film being thicker than said second thermally oxidized film;
   removing said second thermally oxidized film on said base region by anisotropic etching with gaseous ions substantially vertically incident on the surface of said base region with said antioxidant insulation film pattern as a mask, thereby exposing a portion of said base region; and
   forming a base electrode wiring connected to said base region, said base electrode wiring covering said antioxidant insulation film pattern and said first thermally oxidized film.

2. A method according to claim 1, further comprising, the step of implanting in the exposed base region atoms of the same conductivity type as that of said base region after removing said second thermally oxidized film on said base region.

3. A method according to claim 1 or 2, wherein: said base region is of one conductivity type; and
   said conductive layer pattern is made of polycrystalline silicon containing impurity atoms of opposite conductivity type and is used as a diffusion source for forming an emitter region or a collector region of opposite conductivity type.

4. A method for manufacturing a semiconductor integrated circuit device having a plurality of bipolar transistors at least one of which has a base region comprising the steps of:
   forming an insulation film on a part of the base region;
   forming conductive layers directly on said base region and on said insulation film;
   forming an antioxidant insulation film of high insulation characteristic on the conductive layer;
   patterning the antioxidant insulation film to form an antioxidant insulation film pattern;
   overetching the underlying conductive layer with the antioxidant insulation film pattern as a mask to form a conductive layer pattern such that the antioxidant insulation film pattern overhangs the conductive layer pattern;
   thermally oxidizing the circumferential surface of the conductive layer pattern and an exposed part of said base region to grow a first thermally oxidized film on the circumferential surface of the conductive layer pattern and a second thermally oxidized film on the exposed part of said base region, said first thermally oxidized film being thicker than said second thermally oxidized film;
   removing said second thermally oxidized film on said base region by anisotropic etching with gaseous ions substantially vertically incident on the surface of said base region with the antioxidant insulation film pattern as a mask, thereby forming a base contact hole; and
   forming a base electrode wiring connected to said base region, said base electrode wiring covering the antioxidant insulation film pattern and the first thermally oxidized film.

* * * * *